United States Patent
Zhang et al.

(10) Patent No.: US 8,578,605 B2
(45) Date of Patent: Nov. 12, 2013

(54) MANUFACTURING METHOD OF A HEAT DISSIPATION DEVICE WITH GUIDING LINES AND SOLDERED HEAT PIPES

(75) Inventors: Ming-Tang Zhang, Shenzhen (CN); Wei-Hsiang Chang, New Taipei (TW); Nien-Tien Cheng, New Taipei (TW)

(73) Assignees: Furui Precise Component (Kunshan) Co., Ltd., Kunshan (CN); Foxconn Technology Co., Ltd., New Taipei (TW)

( * ) Notice: Subject to any disclaimer, the term of this patent is extended or adjusted under 35 U.S.C. 154(b) by 0 days.

(21) Appl. No.: 13/487,274

(22) Filed: Jun. 4, 2012

(65) Prior Publication Data
US 2012/0234901 A1 Sep. 20, 2012

Related U.S. Application Data

(62) Division of application No. 12/558,602, filed on Sep. 14, 2009, now Pat. No. 8,245,763.

(30) Foreign Application Priority Data

Jul. 13, 2009 (CN) .......................... 2009 1 0304299

(51) Int. Cl.
*B21D 53/02* (2006.01)
(52) U.S. Cl.
USPC ....................................... 29/890.03; 228/256
(58) Field of Classification Search
USPC ........... 228/256; 29/890.03–890.05; 165/177, 165/179, 181, 183
See application file for complete search history.

(56) References Cited

U.S. PATENT DOCUMENTS

| | | | | |
|---|---|---|---|---|
| 1,886,498 | A  * | 11/1932 | Phelps .......................... | 165/150 |
| 6,382,307 | B1 * | 5/2002 | Wang et al. .................. | 165/80.3 |
| 6,435,266 | B1 * | 8/2002 | Wu .............................. | 165/80.3 |
| 6,640,888 | B1 * | 11/2003 | Horng et al. .................. | 165/185 |
| 6,688,380 | B2 * | 2/2004 | Lavochkin et al. ........... | 165/150 |
| 2003/0079862 | A1 * | 5/2003 | Moore et al. .................. | 165/80.3 |
| 2008/0105408 | A1 * | 5/2008 | Zhang et al. ............. | 165/104.33 |
| 2011/0005726 | A1 * | 1/2011 | Zhang et al. ............. | 165/104.26 |

FOREIGN PATENT DOCUMENTS

GB 1455001 A * 11/1976

* cited by examiner

*Primary Examiner* — David Bryant
*Assistant Examiner* — Jacob Cigna
(74) *Attorney, Agent, or Firm* — Wei Te Chung; Ming Chieh Chang

(57) ABSTRACT

An exemplary method of manufacturing a heat dissipation device includes, firstly, providing a heat pipe including a condenser section having a planar outer surface, and providing a heat sink including a supporting surface defining a guiding line. The guiding line has a width smaller than a width of the outer surface of the condenser section. Next, an amount solder is spread on the supporting surface along the guiding line to form a solder layer on the supporting surface. The solder layer has a size not larger than a size of the outer surface of the condenser section. Then the outer surface of condenser section of the heat pipe is attached to the solder layer on the supporting surface of the heat sink.

5 Claims, 4 Drawing Sheets

MANUFACTURING METHOD OF A HEAT DISSIPATION DEVICE WITH GUIDING LINES AND SOLDERED HEAT PIPES

CROSS-REFERENCE TO RELATED APPLICATIONS

This patent application is a divisional application of patent application Ser. No. 12/558,602, filed on Sep. 14, 2009, entitled "HEAT DISSIPATION DEVICE WITH GUILDING LINES AND SOLDERED HEAT PIPES AND MANUFACTURING METHOD THEREOF," which is assigned to the same assignee as the present application, and which is based on and claims priority from Chinese Patent Application No. 200910304299.9 filed in China on Jul. 13, 2009. The disclosures of patent application Ser. No. 12/558,602 and the Chinese Patent Application are incorporated herein by reference in their entirety.

BACKGROUND

1. Technical Field

The disclosure relates to a manufacturing method of a heat dissipation device, and particularly to a manufacturing method of a heat dissipation device for dissipating heat generated by an electronic component.

2. Description of Related Art

Electronic components operating at high speed generate excessive heat which must be removed efficiently to ensure normal operation. Typically, a heat dissipation device attached to the electronic component provides such heat dissipation.

A conventional heat dissipation device includes a heat sink and a heat pipe connected to the heat sink. The heat pipe is linear shaped and has a rectangular planar bottom surface for contacting a side surface of the heat sink. When the heat pipe is combined to the heat sink, a solder layer is spread on a portion of the side surface of heat sink by an operator for fixing the bottom surface of the heat pipe thereon.

However, a position of the solder layer is decided by visual observation of the operator, and the solder layer usually has an irregular shape and an imprecise location. When the bottom surface of the heat pipe is attached to the heat sink, a part of the bottom surface of the heat pipe may directly contact a portion of the side surface without solder spread thereon and thus the connection between the heat pipe and the heat sink is faulty. Furthermore, a portion of the solder layer uncovered by the bottom surface of the heat pipe may melt during soldering and flow to other portions of the side surface uncovered by the bottom surface of the heat pipe, thereby contaminating the heat sink. This results in waste of the solder and trouble required to clean the contamination.

It is thus desirable to provide a manufacturing method of a heat dissipation device which can overcome the described limitations.

DETAILED DESCRIPTION

Figure 1:
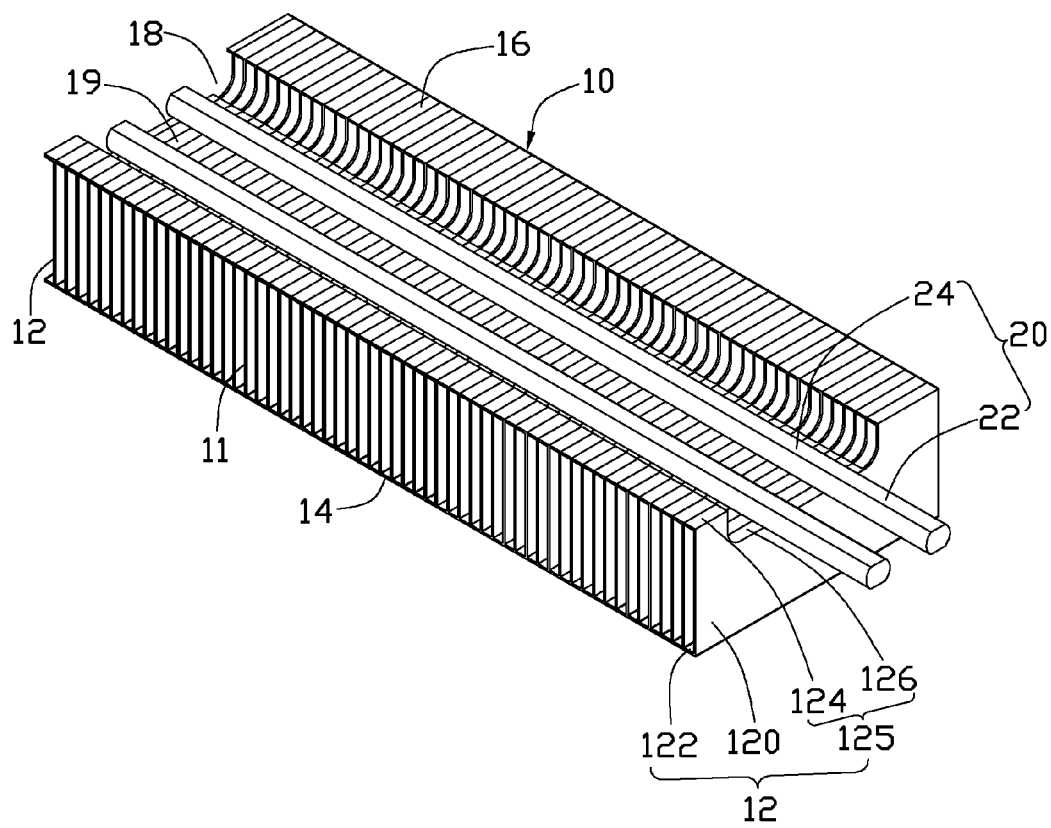
FIG. 1 is an isometric, assembled view of a heat dissipation device according to an exemplary embodiment.

Reference will now be made to the drawing figures to describe the present heat dissipation device and a manufacturing method thereof in detail.

FIG. 1 illustrates a heat dissipation device for dissipating heat generated by an electronic component (not shown). The heat dissipation device includes a heat sink 10 and two heat pipes 20.

Figure 2:
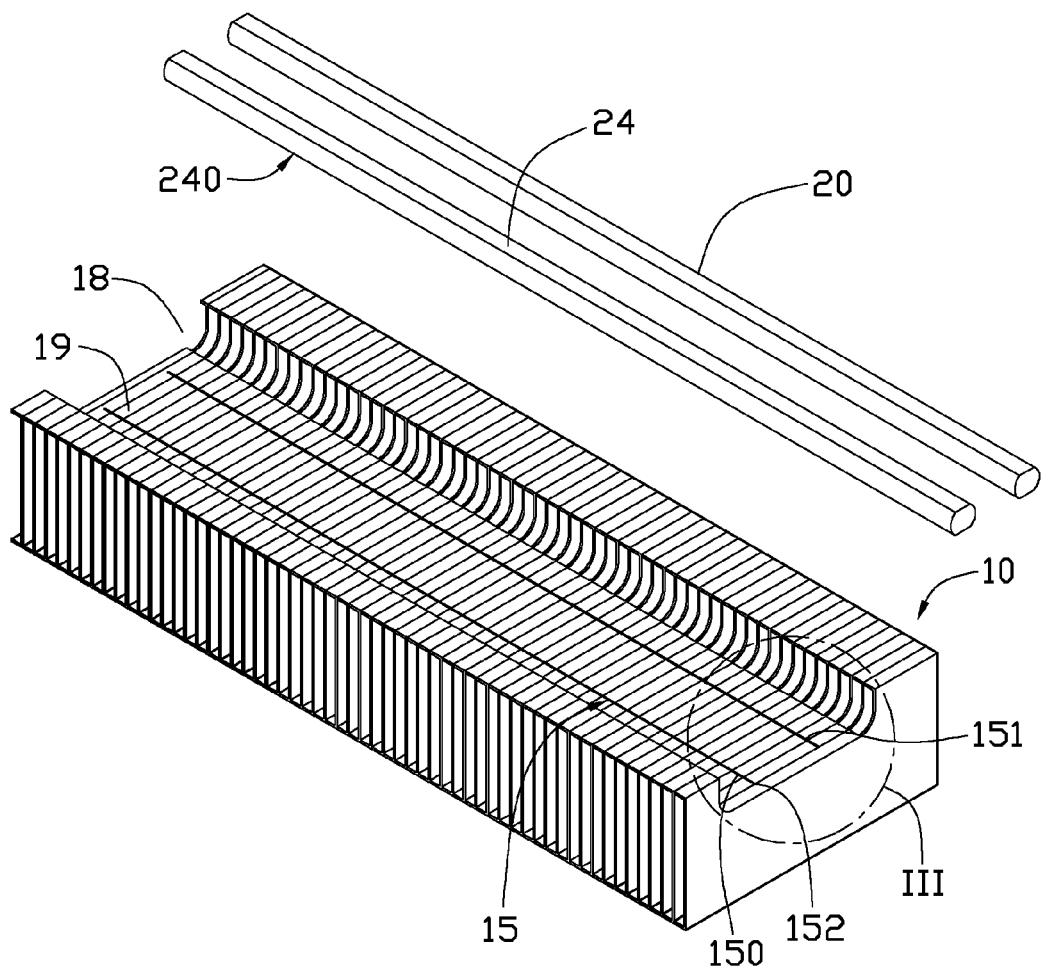
FIG. 2 is an exploded view of the heat dissipation device of FIG. 1.

Referring to FIG. 2, each of the heat pipes 20 is tubular, and includes an evaporator section 22 and an opposite condenser section 24. The condenser section 24 of each of the heat pipes 20 is linear shaped, and has a rectangular planar bottom surface 240.

The heat sink 10 includes a plurality of first fins 11 and a pair of second fins 12. The first fins 11 are located at a central portion of the heat sink 10, and the pair of second fins 12 are arranged at left and right sides of the first fins 11, respectively. The first and second fins 11, 12 are arranged side by side along a left-to-right direction of the heat sink 10. Each of the first and second fins 11, 12 includes a plate-shaped main body 120, a bottom flange 122 extending leftwards and perpendicularly from a bottom side of the main body 120, and a top flange 125 extending leftwards and perpendicularly from a top side of the main body 120. A top side of a middle portion of each main body 120 in a front-to-rear direction is lower than top sides of front and rear portions of the main body 120. Accordingly, a rectangular groove 18 is defined in a middle portion of the heat sink 10 between front and rear portions of the heat sink 10 after the first and second fins 11, 12 are stacked together.

Each of the top flanges 125 includes two upper flange portions 124 formed at the top sides of the front and rear portions of the corresponding main body 120, respectively, and a lower flange portion 126 formed at the top side of the middle portion of the corresponding main body 120. The main bodies 120 of the first and second fins 11, 12 are parallel to and equally spaced from each other. Each of the top and bottom flanges 125, 122 has a width substantially equal to a distance between the main bodies 120 of neighboring fins 11, 12. Each of the top flanges 125 extends perpendicularly from the top side of the main body 120 to contact the main body 120 of a neighboring fin 11, 12. Thus the upper flange portions 124 of the top flanges 125 cooperatively form two planar top surfaces 16 at top sides of the front and rear portions of the heat sink 10, respectively. The lower flange portions 126 of the top flanges 125 cooperatively form a supporting surface 19 at a top side of the middle portion of the heat sink 10. In addition, the bottom flanges 122 of the fins 11, 12 cooperatively form a planar bottom surface 14 at a bottom side of the heat sink 10.

Figure 3:
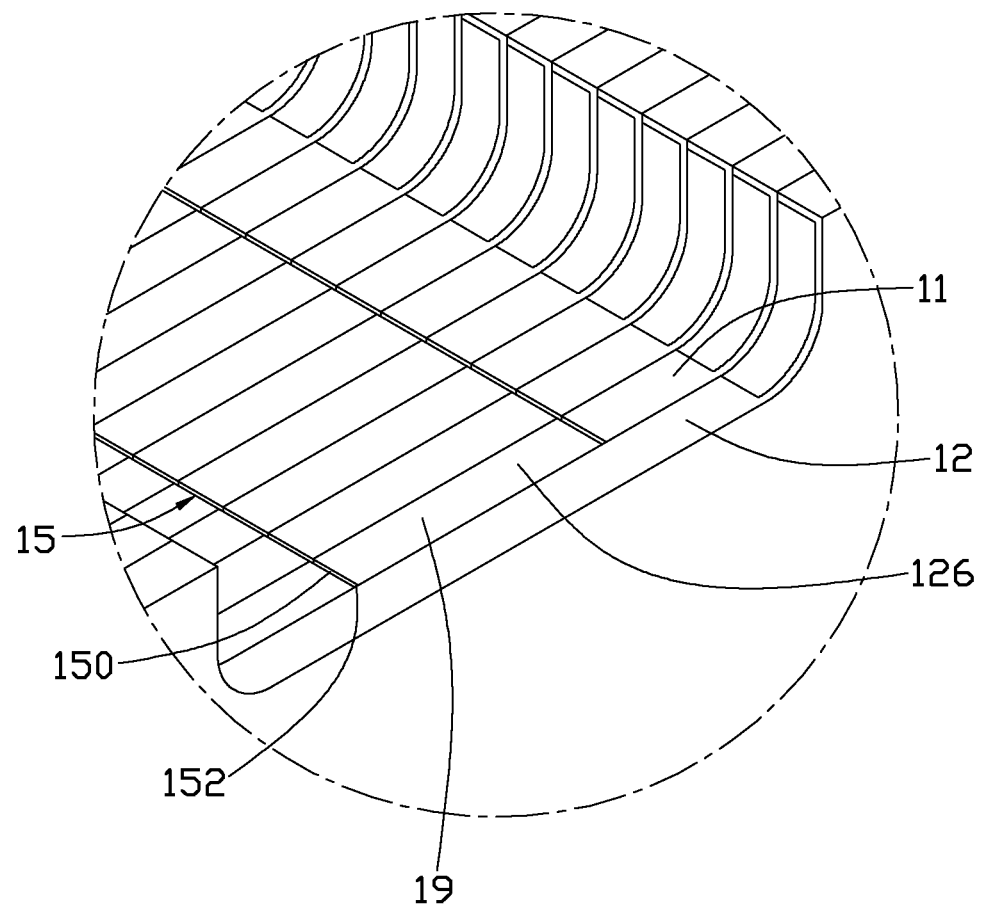
FIG. 3 is an enlarged view of a circled portion III of FIG. 2.

Referring to FIGS. 2 and 3, front and rear cutouts 150, 151 are defined in front and rear ends of each of the lower flange portions 126 of the first fins 11, respectively. The front and rear cutouts 150, 151 of each of the lower flange portions 126 are parallel to each other. Each of the cutouts 150, 151 extends along a bending direction of the lower flange portion 126, and is perpendicular to the main body 120. Each of the cutouts 150, 151 has a length in the left-to-right direction substantially equal to the width of the lower flange portion 126, and a depth slightly smaller than a thickness of the lower flange portion 126. Thus each of the cutouts 150, 151 extends through left and right sides of the lower flange portion 126. The front cutouts 150 of the lower flange portions 126 of each two neighboring first fins 11 are communicated with each other. More specifically, for each two neighboring first fins 11, a right end of the front cutout 150 of a left first fin 11 connects a left end of the front cutout 150 of a right first fin 11. Thus a first guiding line 15 is formed at a front end of the guiding surface 19 of the heat sink 10 by the front cutouts 150 of the lower flange portions 126 after the first fins 11 are stacked together. Similarly, the rear cutouts 151 of the lower flange portions 126 of each two neighboring first fins 11 are communicated with each other, and a second guiding line 15 is formed at a rear end of the guiding surface 19 of the heat sink 10 by the rear cutouts 151 of the lower flange portions 126 after the first fins 11 are stacked together.

When the heat sink 10 is assembled, the first fins 11 are arranged at the central portion of the heat sink 10 side by side, and the second fins 12 are arranged at the left and right sides of the first fins 11, respectively. The first and the second guiding lines 15 are accordingly formed by the front and rear cutouts 150, 151 of the first fins 11 at the front and rear ends of the guiding surface 19, respectively. Each of the guiding lines 15 extends straightly as does the bottom surface 240 of the condenser section 24 of a corresponding one of the heat pipes 20, and each guiding line 15 has a width much smaller than a width of the bottom surface 240 of the condenser section 24 of the corresponding heat pipe 20. Since the second fins 12 do not define cutouts therein and the lower flange portions 126 of the second fins 12 each have completely smooth top and bottom faces, each of the guiding lines 15 forms closed ends 152 at left and right ends thereof, respectively. That is, each of the guiding lines 15 does not extend through the left and right sides of the heat sink 10, and the closed ends 152 of each guiding line 15 are adjacent to the left and right sides of the heat sink 10, respectively.

Figure 4:
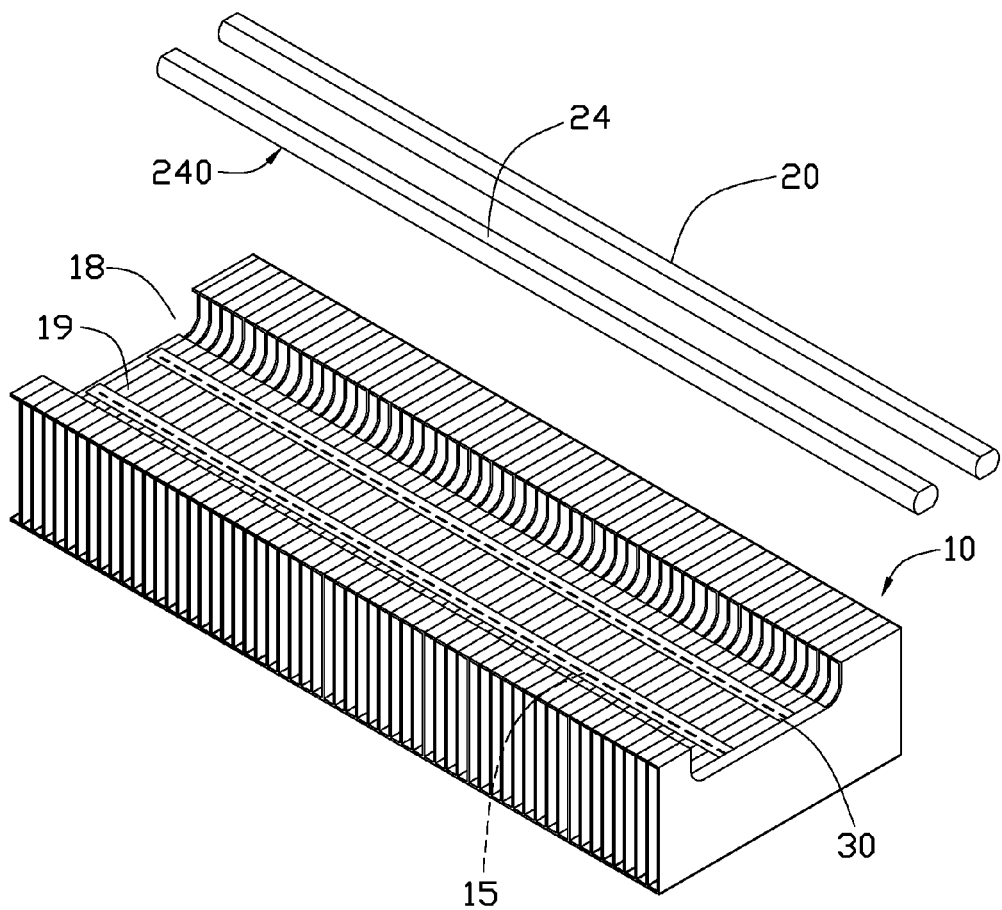
FIG. 4 is a view schematically showing solder layers being formed on a supporting surface of the heat sink along guiding lines thereof.

Referring to FIG. 4, an amount of solder is spread on the supporting surface 19 along the first and second guiding lines 15 to form two straight rectangular solder layers 30 respectively. Each of the solder layers 30 has a size not larger than a size of the bottom surface 240 of the corresponding condenser section 24. In this embodiment, the size of each of the solder layers 30 is substantially equal to the size of the bottom surface 126 of the condenser section 24. Then the heat pipes 20 are positioned on the supporting surface 19 of the heat sink 10, with the bottom surfaces 240 of the condenser sections 24 contacting the solder layers 30, respectively. Finally the heat pipes 20 are soldered to the heat sink 10 by heating the solder layers 30.

Since the guiding lines 15 are provided on the supporting surface 19 of the heat sink 10, the solder can be conveniently spread on correct positions of the supporting surface 19 along the guiding lines 15 to form the straight, rectangular solder layers 30 on the supporting surface 19. Thus the heat pipes 20 can be accurately mounted to the solder layers 30 of the supporting surface 19, and good contact is formed between the heat pipes 20 and the supporting surface 19. Furthermore, since the guiding lines 15 form the closed ends 152 at the left and right ends thereof, when the solder is heated, molten solder will not flow from the guiding lines 15 to the left and right sides of the heat sink 10 to contaminate the heat sink 10. Moreover, the molten solder has a tendency to expand and overflow when heated. The guiding lines 15 can provide a space for receiving the expanded molten solder therein, thereby avoiding the molten solder flowing from the solder layer 30 to other portions of the supporting surface 19 to contaminate the heat sink 10. Thus, the solder between the heat pipes 20 and the heat sink 10 forms a firm connection between the heat pipes 20 and the heat sink 10.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method of manufacturing a heat dissipation device, comprising:
    providing at least one heat pipe comprising a condenser section having a planar outer surface;
    providing a heat sink comprising:
    a supporting surface defining at least one guiding line, the at least one guiding line having a width smaller than a width of the outer surface of the condenser section;
    a plurality of inner fins arranged side by side; and
    a pair of outer fins respectively arranged on two opposite sides of the plurality of inner fins, each of the outer fins comprising a main body and a flange extending perpendicularly from one side of the main body of each outer fin, and each of the plurality of inner fins comprising a main body and a flange extending perpendicularly from one side of the main body of each inner fin, the flanges of the outer fins each having an outer surface which is completely smooth, the at least one guiding line forming closed ends at two opposite ends thereof which are adjacent to the outer fins respectively;
    spreading an amount of solder on the supporting surface along the at least one guiding line to form at least one solder layer on the supporting surface, the at least one solder layer having a size not larger than a size of the outer surface of the condenser section; and
    attaching the outer surface of the condenser section of the at least one heat pipe to the at least one solder layer on the supporting surface of the heat sink.

2. The method as described in claim 1, wherein the at least one heat pipe is soldered to the heat sink by heating the at least one solder layer.

3. The method as described in claim 1, wherein at least one cutout is defined in an outer surface of the flange of each fin of the plurality of inner fins, the cutouts of the flanges cooperatively forming the at least one guiding line along an arranging direction of the plurality of inner fins.

4. The method as described in claim 3, wherein the at least one cutout has a depth smaller than a thickness of the flange.

5. The method as described in claim 3, wherein the cutouts of each two neighboring fins communicate with each other to cooperatively form the at least one guiding line.

* * * * *